United States Patent [19]

Webb

[11] Patent Number: 5,229,661
[45] Date of Patent: Jul. 20, 1993

[54] HIGH SPEED BIPOLAR DIGITAL LOGIC GATE ARCHITECTURE

[75] Inventor: Robert W. Webb, Palm Bay, Fla.

[73] Assignee: Harris Corporation, Melbourne, Fla.

[21] Appl. No.: 806,074

[22] Filed: Dec. 11, 1991

[51] Int. Cl.$^5$ ............... H03K 19/013; H03K 19/016
[52] U.S. Cl. .................................. 307/454; 307/455
[58] Field of Search ..................... 307/454, 455, 443

[56] References Cited

U.S. PATENT DOCUMENTS

| | | | |
|---|---|---|---|
| 4,210,830 | 7/1980 | Fukahori | 307/455 |
| 4,623,802 | 11/1986 | Cline et al. | 307/455 |
| 4,845,387 | 7/1989 | Ovens | 307/455 |

Primary Examiner—Edward P. Westin
Assistant Examiner—Andrew Sanders
Attorney, Agent, or Firm—Evenson, Wands, Edwards, Lenahan & McKeown

[57] ABSTRACT

A current mode (NOR) logic circuit includes a first, fixed reference current source transistor stage coupled in circuit between a first voltage supply terminal and an input current node. A second, variable current source transistor stage is coupled in circuit between the first voltage supply terminal and the input current node. The second, variable current source supplies a variable quantity of auxiliary current to the input current node in dependence upon whether the input node sees a high logical level current or a low logic level current. The magnitude of the auxiliary current is such that the total of the auxiliary current and the prescribed reference current balances the input current being supplied to the input current node. A current switch transistor has its collector-emitter current flow path coupled in circuit between the first current source and one or more output current transistors. Base biasing of the current source transistors and the current switch transistor is independent of the power distribution bus for the overall system architecture in which the NOR gate is employed, so that the operations of the transistor stages are effectively immune to current transients on the power distribution bus. In addition, the bias voltages are such as to prevent transistor stages from operating in a saturation condition for either of the first and second input current levels, so that the speed-power product of the logic circuit is increased.

46 Claims, 2 Drawing Sheets

DTL

ECL

I²L

HIGH SPEED BIPOLAR DIGITAL LOGIC GATE ARCHITECTURE

FIELD OF THE INVENTION

The present invention relates in general to digital signal processing circuits and is particularly directed a new and improved bipolar (NOR gate) circuit architecture, state-control transistors of which operate at less than saturation current levels and the input node of which undergoes a very low voltage swing for logic state transitions, thereby providing a NOR gate circuit having a high speed-power product.

BACKGROUND OF THE INVENTION

Digital logic circuit architectures are essentially one of two types:—voltage mode logic circuits (where the logical variable is represented by a node voltage or the difference between two node voltages) and current mode logic circuits (where the logical variable is represented by the presence or absence of a branch current relative to a node). Examples of voltage mode logic circuits are illustrated in FIG. 1, which shows a bipolar diode-transistor logic (DTL) architecture, and FIG. 2, which shows an emitter-coupled logic (ECL) architecture. An example of a current mode logic circuit is illustrated in FIG. 3 as a current injection logic or ($I^2$)L-configured bipolar transistor architecture.

In each of these conventionally employed schemes, the loop and node equations which define the logical operation of the extended circuit (namely including the output of a driving logic circuit and the input of a cascaded or driven logic circuit) are necessarily impacted by current transients in one or more power distribution (e.g. Vcc, Vee, ground) rails to which the bipolar components are connected and the effect of which is diagrammatically represented as a noise voltage source Vn.

In addition, voltage differentials of various nodes of voltage mode logic circuitry are often on the order of hundreds of millivolts (e.g. on the order of 500 to 600 millivolts for an ECL mode circuit) to several volts (e.g. up to five volts for a CMOS digital logic circuit). Unfortunately, the parasitic capacitances associated with such nodes are often coupled with adjacent (analog) circuits in an overall signal processing architecture, so that such node variations of the logic circuit may be sensed by and erroneously affect the operation of the analog circuit.

Within conventional current injection logic circuits, not only may node voltage variations be substantial (up to 500 mv), but both PNP and NPN devices customarily operate at saturation, so that the speed-power product is relatively poor.

SUMMARY OF THE INVENTION

In accordance with the present invention, the above-described problems of conventional voltage mode and current mode digital logic architectures are obviated by a new and improved current mode logic circuit which enjoys relatively low node voltage swings, which are considerably lower than in current injection logic circuits, In addition, saturation is avoided by limiting the minimum collector-base voltage. Switching speed is also improved due to the absence of saturation recovery and the small differential voltages at the control nodes. The current levels can be comparable to those in current injection logic circuits or larger. Thus, the speed-power product is significantly enhanced compared to conventional current injection logic.

In particular, the present invention is directed to a new and improved current mode logic circuit, which effectively operates as a NOR gate, having an input current node, which may connected to a plurality of current logic level terminals, to each of which one of a respective logic state representative current from an upstream logic circuit stage is applied. Namely, each terminal to which the current input node of the NOR gate is coupled receive either a first input current level (e.g. a relatively high input current flow condition representative of a first logic state) or a second input current level (e.g. a relatively low input current or open circuit condition representative of a second logic state).

The inventive logic circuit also includes one or more output current nodes, from each of which either a first (relatively high) output current level representative of the first logic state, or a second (relatively low or open circuit) output current level representative of the second logic state, is derived. Driving each output node is a respective output current switching device which is arranged to be driven to supply either the first output current level (logical high) or the second output current level (logical low).

A first, fixed current source, which is biased to supply a prescribed value reference current, is formed of a first bipolar transistor stage, containing a pair of NPN and PNP transistors, having their collector-emitter current flow path coupled in circuit between a first voltage supply terminal and the input current node. A second, variable current source, formed of a second bipolar transistor stage, has its collector-emitter current flow path coupled in circuit between the first voltage supply terminal and the input current node. The second, variable current source is operative to supply a variable quantity of auxiliary current to the input current node, which auxiliary current varies in dependence upon whether the input node sees the first input current level (associated with the first logic state) or the second input current level (associated with the second logic state).

Specifically, the second, variable current source supplies a first additional current to the input current node in response to the first input current level being supplied to the input current node from any one of the input terminals, and supplies a second reduced or minimal current value to the input current node in response to the second input current level being applied to the input current node from each of the input terminals. The emitter of the second bipolar transistor stage is coupled to the current input node, so that its base-emitter voltage is determined by the voltage at the current input node. The second transistor stage is operative to supply auxiliary current to the input current node in dependence upon the flow of current from the first current source into the emitter of a third bipolar transistor stage that forms a current switch between the first current source and the at least one output switching device. The magnitude of the auxiliary current is such that the total of the auxiliary current and the prescribed reference current balances the input current being supplied to or drawn by the input current node.

The current switch, which is formed of a third bipolar transistor stage, as noted above, has its collector-emitter current flow path coupled in circuit between the first current source and the one or more output current switching devices. The base-emitter path of the third bipolar transistor stage is coupled in series with the base-emitter path of the second bipolar transistor stage between second and third bias voltage terminals, which are independent of the power distribution bus for the overall system architecture in which the NOR gate is employed. As a consequence, the operation of the second and third bipolar transistor stages are effectively immune to transients on the power distribution bus. In addition, the values of the second and third bias voltages are such as to prevent the second and third bipolar transistor stages from operating in a saturation condition for either of the first and second input current levels, so that the speed-power product of the logic circuit is increased.

In response to the application of the second input current level to the input current node, the current switch is operative to controllably couple the reference value current, supplied by the first current source, to an output driver transistor which is couple in circuit with the current switch and has its base electrode coupled in common with the base electrodes of output transistors that make up the one or more output current switching devices. The base input of the output driver transistor is coupled to its collector, so that its base-emitter junction becomes forward biased in response to the current switch coupling the reference value current from the first current source to collector-emitter path of the driver transistor.

In response to the application of the first (logical high) input current level to the input current node, the base-emitter voltage of the third transistor stage of the current switch is insufficient to supply the reference value current to the output driver transistor. This causes each output current switching device to output the low logic level output current level to its output node. The reference current value is sunk through the input current node to an input current logic device, which substantially reduces the voltage at the input node. This action forward biases the base-emitter junction of the second transistor stage of the variable current source, which then supplies the necessary auxiliary current to the input current node to satisfy the current demand of the upstream logic device which is coupled to the current input node.

Conversely, in response to the application of the second (logical low) input current level to the input current node, the base-emitter voltage of the third transistor stage of the current switch increases, causing it to conduct, whereby the reference value current from the first current source is coupled to the output driver transistor. This causes each output current switching device to output the high logic level output current level to its output node. The flow of the reference current value through the third transistor stage increases the voltage on the input node and thereby at the emitter of the second transistor stage of the variable current source. The base-emitter voltage of the second transistor stage of the variable current source is thereby reduced, so that the auxiliary current output of the second current source is reduced, whereby the current flowing into the current input node drops to the second, relatively low logic state current level.

The values of the second and third bias voltages for the second and third transistor stages and the reference current value are such that the difference between the voltage at the input current node, when the first input (logical high) current level is applied to the input current node, and the voltage at the input current node, when the second (logical low) input current level is applied to the input current node, is on the order of only 100 mv or less, so that the present invention provides both a significantly reduced node voltage differential and reduced control transistor current flow, thus increasing the speed-power product.

DETAILED DESCRIPTION

Figure 1:
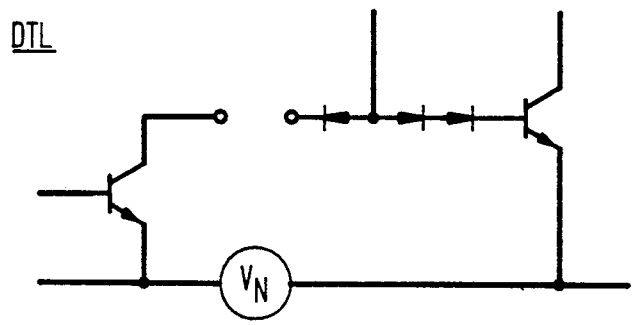
FIG. 1 shows an example of a diode-transistor logic (DTL) architecture.
Figure 2:
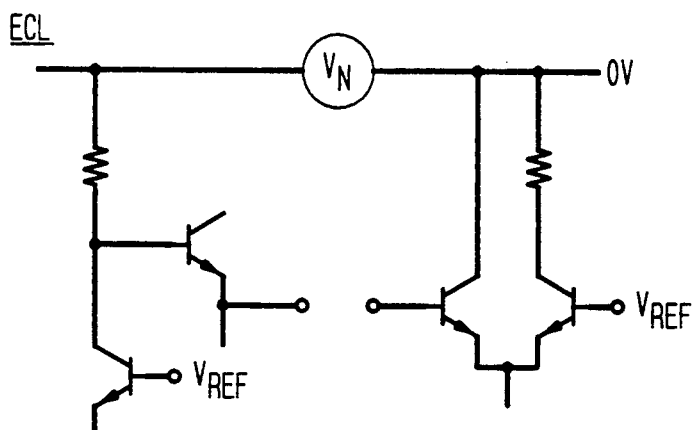
FIG. 2 shows an example of emitter-coupled logic (ECL) architecture.
Figure 3:
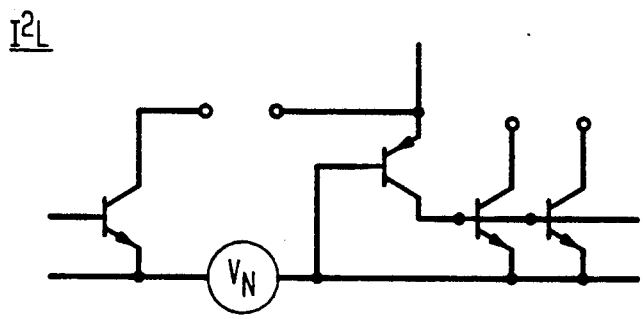
FIG. 3 shows an example of a current injection logic ($I^2L$) bipolar transistor architecture.
Figure 4:
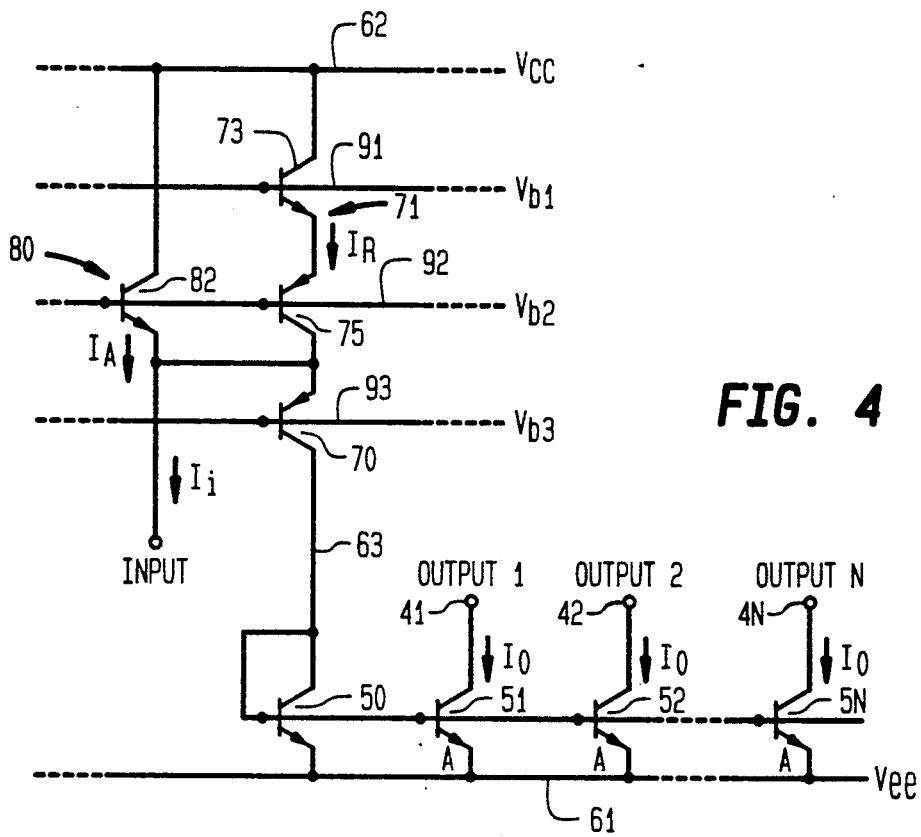
FIG. 4 is a schematic diagram of a current mode bipolar NOR gate circuit according to the present invention.
Figure 5:
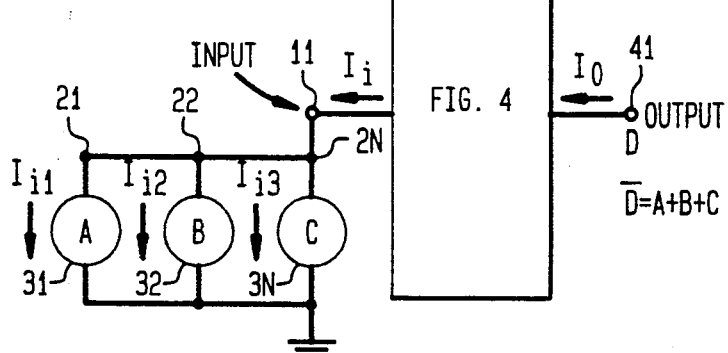
FIG. 5 diagrammatically shows the NOR gate of FIG. 4 coupled to a plurality of terminals, respectively coupled to receive either a logical high or low input current value.

Referring now to FIG. 4, an embodiment of a high speed current mode (NOR) logic gate in accordance with the present invention is schematically illustrated as comprising an input node 11 to which an input current representative of a logic state is to be applied. For the embodiment of a NOR gate, input node 11 may be coupled to a plurality of terminals, as diagrammatically shown at 21, 22 . . . 2N in FIG. 5, respectively coupled to receive either a logical high or a logical low input current value from upstream circuitry denoted as current sources 31, 32 . . . 3N. Each of the current sources 31–3N outputs either one of the logical high or logical low input current values IH or IL. For purposes of the present discussion, a logical high input current value IH represents the condition that the upstream device to which the terminal is coupled sources or sinks a relatively large or appreciable magnitude current, with which the logical value '1' is associated. Conversely, a logical low input current value IL represents the condition that the upstream device to which the terminal is coupled sources or sinks a relatively low magnitude large or non-appreciable current, with which the logical value '0' is associated.

The output of the logic circuit of FIG. 4 is derived by way of one or more output nodes 41, 42 . . . 4N, from each of which one of a logical high output current value OH and a logical low output current value OL is derived in accordance with the current applied to input terminal 11. For purposes of the present discussion, a logical high output current value OH represents the condition that the output node sources or sinks a relatively large or appreciable magnitude output current, with which the logical value '1' is associated. Conversely, a logical low output current value OL represents the condition that the output node sources or sinks a relatively low magnitude large or nonappreciable output current, with which the logical value '0' is associated.

Each output node is coupled to the collector or a respective output current NPN transistor 51, 52 . . . 5N, which are coupled in common emitter and common base configuration with a diode-connected output driver NPN transistor 50. The emitter of each of transistors 50-5N is biased by way of a power bus 61 (e.g. ground or Vee). The output node driver circuitry is such that when a sufficient current is applied to the collector of output driver transistor 50, each of the output transistors 51-5N is forward biased and rendered conductive to sink or source a logical high value output current OH. On the other hand, when the current applied to the collector of output driver transistor 50 is substantially reduced, none of the output transistors 51-5N is forward biased sufficiently to sink or source a logical high value output current OH. Instead, the collector current of each output transistor 51-5N drops to a logical low output current value OL.

The base drive current for each of transistors 50-5N is derived from the collector path 63 of output driver transistor 50, which is switchably coupled through a current switch transistor 70 to a first current source 71 comprised of a pair of PNP and NPN transistors 73 and 75. Current source transistors 73 and 75 have their collector-emitter paths coupled in series between a (Vcc) voltage bias bus 62 and current switch transistor 70. Current switch transistor 70 has its collector-emitter current flow path coupled in series with current source 71 and the collector of output driver transistor 50. Current switch transistor 70 is operative to controllably couple a prescribed reference current IR supplied by current source 71 to the collector path 65 of output driver transistor 50.

The base electrodes of current source transistors 73, 75 and the base electrode of current switch transistor 70 are respectively coupled to base bias voltage terminals 91, 92, 93, to which respective bias voltages Vb1, Vb2 and Vb3 are applied. These base bias voltages are separate and independent of the power supply buses 61 and 62 for supplying (Vee or ground and Vcc supply voltages), so that they are not influenced by noise transients propagating along the power buses. The voltage Vb1 of bias voltage terminal 91 is made negative relative to the bias voltage Vcc of bus 62 by an amount (e.g. 0.5V) that is sufficient to prevent transistor 73 from saturating in the presence of local disturbances on power rail 62, I-R drops on bus 62, and the I-R drop across the collector region of transistor 73. The voltage Vb2 of bias voltage terminal 92 is made negative relative to Vb1 by the sum of the base-emitter voltage VBE of transistor 73 and the base-emitter voltage VBE of transistor 75 as necessary to establish the desired reference current IR in transistors 73 and 75 of current source 71. The voltage Vb3 of bias voltage terminal 93 is sufficiently negative relative to bias voltage Vb2 by an amount necessary to allow transistor 70 to conduct the current IR, plus that required to bias transistor 82 at a value of 10 collector current approximately equal to IA, or IR/100). The voltage Vee at power supply rail 61 is made negative relative to Vb3 of terminal 93 by an amount equal to the sum of the VBE of transistor 50 operating at a collector current of IR, plus a prescribed voltage (e.g. approximately 0.5V) to provide adequate back bias on the collector-base junction of transistor 70 to prevent saturation of transistor 70 in the presence of I-R drops on Vee bus 61, I-R drops across the collector region of transistor 70 and local transient disturbances on bus 61.

A second, variable current source 80, formed of a second NPN transistor stage 82, has its collector-emitter current flow path coupled in circuit between the first voltage supply terminal 62 and the input current node 11. Variable current source 80 is operative to supply a variable quantity of auxiliary current IA to input current node 11, which auxiliary current quantity varies in dependence upon whether the input node sees the first, logical high input current level IH or the second, logical low input current level IL.

Specifically, variable current source 80 supplies a first, relatively large, additional current IAH to the input current node 11, in response to the first, logical high input current level IH being supplied to the input current node (from any one of the input terminals 21, 21, ... 2N). It also supplies a second, relatively low or minimal current IAL to input current node 11 in response to the second, low logic level input current IL being applied to input current node 11 (from each of input terminals 21, 22, ... 2N). The emitter of the second bipolar transistor stage 82 is coupled to current input node 11, so that, with its base being coupled to bias voltage terminal 92 to which a fixed bias voltage Vb2 is applied, its base-emitter voltage is determined by the voltage at the current input node 11.

Current switch transistor 70 has its collector-emitter current flow path coupled in circuit between first current source 71 and driver transistor 50. The base-emitter path of current switch transistor 70 is coupled in series with the base-emitter path of the variable current source transistor 82 between second and third bias voltage terminals 91 and 92, respectively, which, as noted above, are independent of the power distribution buses 61, 62 for the overall system architecture in which the logic circuit is employed. As a consequence, the operation of each of fixed current source transistors 73, 75, variable current source transistor 82 and current switch transistor 70 are effectively immune to current transients on the power distribution bus links. In addition, as noted above, the values of the second bias voltage Vb1 and the third bias voltage Vb2 are such as to prevent the transistors 82 and 70 from operating in a saturation condition of either of the logical high and logical low input currents IH and Il, thereby enhancing the speed-power product of the logic circuit.

OPERATION

LOGICAL LOW INPUT CURRENT (IL)

In response to the application of a logical low input current IL to input current node 11, for example in the case that input node sees an open circuit condition, the entirety of the reference current IR supplied by current source 71 is applied from the collector of transistor 75 to the emitter of current switch transistor 70, thereby increasing the emitter potential of current switch transistor 70. Since current switch transistor 70 is a PNP transistor, its base-emitter junction becomes forward biased, so that current switch transistor 70 is rendered conductive, to couple the reference value current IR from current source 71 to the collector-base connection of output driver transistor 50. The base potentials of NPN output driver transistor 50 and parallel-coupled NPN output transistors 51-5N are increased, so that their base-emitter junctions become forward biased. As a consequence, each of output transistors 51-5N supplies an output current OH at its respective current output node. This output current is coupled as an input current to one or more downstream logic circuits (e.g. additional NOR gates having the configuration of FIG. 4) within an overall digital signal processing architecture.

Because the magnitude of the reference current IR supplied by current source 71 is less than the magnitude of the high logical state input current IH, it is necessary that output transistors 51-5N perform current amplification with respect to the collector-emitter current flowing through driver transistor 50, so that the magnitude of their output currents OH will be sufficient to drive the input node of a downstream logic circuit high. For this purpose, the emitter areas of transistors 51-5N may be some product K (e.g. K = 1.5) of the emitter area of driver transistor 50, so that the magnitude of output current OH is equal to K times the reference current IR. When applied as an input current (IH) to the input node of a downstream (NOR gate) logic circuit, this current will be sufficient to draw current from the variable current source transistor.

LOGICAL HIGH INPUT CURRENT (IH)

In response to the application of the first (logical high) input current level IH to input current node 11, the reference current IR supplied by current source 71 will be sunk through the input node to the input current source causing the base-emitter voltage of current switch transistor 70 to decrease, so as to render current switch transistor 70 insufficiently conductive to couple the reference current IR to the collector of output driver transistor 50. As a result, the base drive for each of output current switching transistors 51-5N is reduced, whereby the output current at each of output nodes 41-4N is at a low logic level IOL.

Since the reference current I is sunk through input current node 11 (to an input current logic device), the reduced voltage at the input node causes the base-emitter voltage of variable current source transistor 82 to be increase, forward biasing transistor 82, whereby an auxiliary current (IAH) is coupled through the collector-emitter path of transistor 82 to input current node 11. This auxiliary current increases to a value which, when summed with the reference current supplied to node 11 by current source 71, satisfies the current demand (IH) of the upstream logic circuit.

The values of the second and third bias voltages for transistors 70 and 82 and the reference current value IR ar such that the difference between the voltage at input current node 11 when the first input (logical high) current level IH is applied to the input current node, and the voltage at the input current node when the second (logical low) input current level IL is applied to the input current node, is on the order of only 100 mv or less. As a result, the time required for the input node to transition between complementary logic levels is considerably reduced than in the case of typical voltage mode circuit, where node voltages on the order of hundreds of millivolts and greater are the norm. This problem in voltage mode circuits is particularly acute where the voltage on the input node is relatively large and has remained at the same large value for an extended period of time. Associated capacitances will be charged to values that depart from their equilibrium values by substantial amounts, so that when the node voltage changes sign, the time required to slew back to equilibrium before the output can transition to its correct logic level is considerably longer than in the case where the node voltage swing is relatively small. These predefined bias parameter values Vb1, Vb2, Vb3 also prevent the respective transistor stages from operating in a saturation condition for either of the first and second input current levels, so that the speed-power product of the logic circuit is increased.

The circuit of FIG. 4 relative to the logic current levels $IL=I_{iL}$, $IH=I_{iH}$, $OL=I_{OL}$, $OL=I_{OH}$ may be analyzed in terms of the designable parameters, which include the emitter area ratio A of output transistors 51-5N relative to the emitter area of driver transistor 50, the reference bias current IR = I, and the bias voltage difference $V_{b2}-V_{b3}=V$. It is clear from inspection that when $I=I_{IL}$, the auxiliary emitter current IA of variable current source transistor 82, $IA=I_3$, will take on its minimum value I3r, and the emitter current of transistor 70, I4, will simultaneously take on its maximum value I4H. Conversely, when $I_i=I_{iH}$, I3 and I4 will be maximum and minimum at I3H and I4L respectively.

Figure 6:
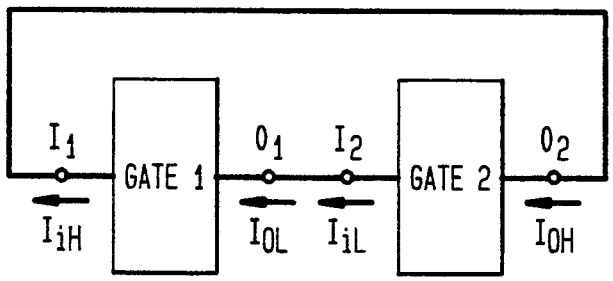
FIG. 6 diagrammatically illustrates an arrangement of two of the NOR gates of FIG. 4 in which one output of each gate is connected to the input of the other.

Consider an arrangement of two gates (Gate 1 and Gate 2) shown in FIG. 6 in which one output of each gate is connected to the input of the other. The output of the left hand gate (Gate 1) is low, $I_O=I_{OL}$, and the output of the right hand gate (Gate 2) is high, $I_O=I_{OH}$. By symmetry, this may be reversed arbitrarily. Therefore, summing currents at the input nodes, the following equations may be derived.

$$I+I_3=I_i+I_4 \tag{0}$$

$$I+I_{3L}=I_{iL}+I_{4H}, \text{ and} \tag{1}$$

$$I+I_{3H}=I_{iH}+I_{4L} \tag{2}$$

$$I_{iL}=I_{OL}=AI_{4L}, \quad I_{iH}=I_{OH}=AI_{4H} \tag{3}$$

Substituting equation (3) into equations (1) and (2)

$$I+I_{3L}=AI_{4L}+I_{4H} \tag{4}$$

$$I+I_{3H}=I_{4L}+AI_{4H} \tag{5}$$

Subtracting equation (4) from equation (5)

$$I_{3H}-I_{3L}=-I_{4L}(A-1)+I_{4H}(A-1),$$

$$I_{3H}-I_{3L}=(I_{4H}-I_{4L})(A-1) \tag{6}$$

In going from an input low to an input high state, the base-emitter voltage of transistor 82 undergoes a change.

$$\Delta V_{BE3}=V_T \ln((I_{3H})/(I_{3L}))$$

Simulataneously $$\Delta V_{eB4}=V_T \ln((I_{4L})/(I_{4H}))$$

Since $V_{BE3}+V_{EB4}=V_{b2}-V_{b3}=$ a constant.

$$\Delta V_{BE3}+\Delta V_{EB4}=0$$

$$V_T \ln((I_{3H})/(I_{3L}))=-V_T \ln((I_{4L})/(I_{4H}))=V_T \ln((I_{4H})/(I_{4L}))$$

$$(I_{3H}/I_{3L})=(I_{4H}/I_{4L}) \tag{7}$$

Defining $$p=(I_{3H}/I_{3L})=(I_{4H}/I_{4L}) \tag{8}$$

Substituting equation (8) into equation (6), one obtains $$(p-1) I_{3L}=(p-1) I_{4L} (A-1)$$

$$I_{3L}=(A-1) I_{4L} \tag{9}$$

Also, substituting equation (8) into equation (9), $$(I_{3H}/p) = (A-1)(I_{4H}/p),$$

$$I_{3H} = (A-1) I_{4H} \qquad (10)$$

Substituting equation (9) into equation (4)

$$I + (A-1) I_{4L} = AI_{4L} + I_{4H},$$

$$I + I_{4L} + I_{4H} \qquad (11)$$

Substituting equations (9) and (10) into equation (11), $$I = (I_{3L}/(A-1)) + (I_{3H}/(A-1)),$$

$$I(A-1) = I_{3L} + I_{3H} \qquad (12)$$

Substituting equation (8) into equation (11), $$I + (I_{4H}/p) + I_{4H} = I_{4H}((1+p)/(p))$$

$$I_{4H} = I((p)/(1+p)) \qquad (13)$$

Substituting equation (8) into equation (12), $$I(A-1) = I_{3L} + pI_{3L} = I_{3L}(1+p)$$

$$I_{3L} = I((A-1)/(1+p)) \qquad (14)$$

The bias voltage $V = V_{b2} - V_{b3}$ is given by $$\begin{aligned} V &= V_{BE3}(I_3 = I_{3L}) + V_{EB4}(I_4 = I_{4H}) \\ &= V_T \ln((I_{3L})/(I_{sn})) + V_T \ln((I_{4H})/(I_{sp})), \\ &= V_T \ln((I_{3L} I_{4H})/(I_{sn} I_{sp})) \end{aligned} \qquad (15)$$

where $I_{sn}$ and $I_{sp}$ are the saturation currents of NPN and PNP transistors, respectively.

Substituting equations (13) and (14) into equation (15) one obtains $$V = V_T \ln [(I^2(A-1)p)/((p+1)^2 I_{sn} I_{sp})] \qquad (16)$$

Thus, given a fundamental bias current level I, the saturation currents $I_{sn}$ and $I_{sp}$, and desired values of A and p, one can calculate the desired separation between $V_{b2}$ & $V_{b3}$.

An immediate consequence of equation (16) is the fact that A must be greater than 1. To evaluate the significance of the quantity p, consider the ratio of the output high current to the output low current:

$$(I_{OH}/I_{OL})$$

Since $I_{OH} = AI_{4H}$ and $I_{OL} = AI_{4L}$, one obtains $$(I_{OH}/I_{OL}) = (I_{4H}/I_{4L})$$

This is equal to p, by equation (8).

In the application of this logic form there will be occasion to connect an output of each of several gates to the input of one gate. If the quantity p is not made large enough, an accumulation of several $I_{iL}$'s may begin, in their sum, to approach a logical "1" input, or at least, to approach the input threshold. The threshold is defined to be that value of input current $I_{iT}$ that produces an output current $I_{OT}$ such that $$I_{OT} = I_{iT} = AI_{4T} \qquad (17)$$

Substituting into equation (0) one obtains:

$$I + I_3 = I_{iT} + I_{4T} = I_{iT} + (I_{iT}/A) = I_{iT}((1+A)/(A)) \qquad (18)$$

It is necessary to know $I_3$ at $I_i = I_{iT}$, $I_{3T}$
Consider equation (15):

$$V = V_T \ln((I_{3L} I_{4H})/(I_{sn} I_{sp})) = V_{b2} - V_{b3}$$

More generally, $$V = V_T \ln((I_3 I_4)/(I_{sn} I_{sp}))$$

Specifically, $$V = V_T \ln((I_{3T} I_{4T})/(I_{sn} I_{sp}))$$

One must then have $$I_{3T} I_{4T} = I_{3L} I_{4H} \qquad (19)$$

Again, using equations (13) & (14) one obtains $$I_{3L} I_{4H} = I((p)/(1+p)) I((A-1)/(1+p)),$$

so that $$I_{3T} = (1/I_{4T}) I^2 (p(A-1)/(1+p)^2) = (A/I_{iT}) I^2 (p(A-1)/(1+p)^2) \qquad (20)$$

Substituting into equation (18), $$I + (A/I_{iT}) I^2 p(A-1)/(1+p)^2 = I_{iT}((1+A)/(A))$$

Multiplying through by $I_{iT}((A)/(1+A))$, one obtains $$I^2_{iT} - I((A)/(1+A))$$
$$I_{iT} - (A^2(A-1)pI^2/(A+1)(1+p)^2 = 0$$

The solutions are $I_{iT} = (-b/2)\{1 \pm [1-(4ac/b^2)]^{1/2}\}$

Thus, $$4ac/b^2 = (4A^2(A-1)pI^2/(A+1)(1+p)^2) \cdot ((1+A)^2/A^2 I^2)$$

$$4ac/b^2 = (4p(A-1)(A+1)/(1+p)^2) \qquad (21)$$

Assuming that $(A-1)(A+1) \approx$, $p >> 1$, one obtains $$4ac/b^2 << 1 \text{ and}$$

$$I_{iT} = (-b(2)/2) = -b = (IA/(1+A))$$

In the context of the previous discussion, it is important that $I_{OL}$ be much less than $I_{OT} = I_{iT}$. From equation (3)

$$I_{OL} = AI_{4L}$$

From equation (8), $$I_{4L} = (I_{4H}/p) \text{ and}$$

from equation (13), $$I_{4H} = I((P)/(1+p))$$

Therefore, $$I_{OL} - (AI/p) \cdot ((p)/(1+p)) = (AI/(1+p))$$

The ratio $(I_{OL}/I_T) = (AI/1+p) \cdot (1+A/IA) = ((1+A)/(1+p))$

Thus, $I_{OL}$ can be made arbitrarily small relative to the threshold.

As will be appreciated from the foregoing description of the present invention, the previously described problems of conventional voltage mode and current mode digital logic architectures are obviated by a current mode logic circuit which not only enjoys relatively low node voltage swings, but additionally operates at current levels considerably below saturation, so that the speed-power product is significantly enhanced compared to conventional I²L logic. Since the second and third bias voltage terminals are independent of the power distribution bus for the overall system architecture in which the NOR gate is employed, the operation of the second and third bipolar transistor stages are effectively immune to transients on the power distribution bus. In addition, the values of the second and third bias voltages are such as to prevent the second and third bipolar transistor stages from operating in a saturation condition for either of the first and second input current levels, so that the speed-power product of the logic circuit is increased.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A current mode logic circuit comprising:
    an input node to which an input current representative of a logic state is applied;
    at least one output node from which an output current representative of a logic state is derived;
    a first current source coupled to said input node;
    at least one output current switching device respectively coupled to said at least one output node;
    a current switch coupled to said first current source and said at least one output current switching device, and being operative to controllably couple current from said first current source to said at least one output current switching device in accordance with the input current state of said input node; and
    a second controllable current source coupled to with said input node and said current switch and being operative to supply current to said input node in accordance with the controllable coupling of current from said first current source to said at least one output current switching device by said current switch.

2. A current mode logic circuit according to claim 1, wherein said second current source is coupled to a first prescribed voltage supply terminal, said current switch is coupled to a second prescribed voltage supply terminal, and wherein said current switch and said second current source are configured so as to operate independently of voltage fluctuations of said first and second prescribed voltage supply terminals.

3. A current mode logic circuit according to claim 2, wherein said second current source and said current switch comprise respective first and second bipolar transistor stages.

4. A current mode logic circuit according to claim 3, wherein said first bipolar transistor stage has its base-emitter path coupled in series with the base-emitter path of said second bipolar transistor stage between first and second bias voltage terminals.

5. A current mode logic circuit according to claim 4, wherein the values of said first and second bias voltages are such as to prevent said first and second bipolar transistor stages from operating in a saturation condition regardless of the input current state of said input current node.

6. A current mode logic circuit according to claim 1, wherein said at least one output current node comprises a plurality of output current nodes, and said at least one output current switching device comprises a plurality of output current switching devices respectively coupled to said plurality of output current nodes.

7. A current mode logic circuit comprising:
    an input current node to which an input current representative of a logic state is applied;
    at least one output current node from which an output current representative of a logic state is derived;
    a controllable current source coupled to said input current node;
    at least one output current switching device respectively coupled to said at least one output current node; and
    a current switch coupled to said input current node, said controllable current source and said at least one output current switching device, and being responsive to a first input current state of said input current node to controllably couple current from said controllable current source to said at least one output current switching device sufficient to place said at least one output current switching device in a first current mode state, and being responsive to a second input current state of said input current node to controllably couple current from said controllable current source to said input current node, such that current supplied from said controllable current source to said at least output current switching device is insufficient to place said at least one output current switching device in said first current mode state.

8. A current mode logic circuit according to claim 7, wherein said controllable current source is coupled to a first prescribed voltage supply terminal, said current switch is coupled to a second prescribed voltage supply terminal, and wherein said current switch and said controllable current source are configured so as to operate independently of voltage fluctuations of said first and second prescribed voltage supply terminals.

9. A current mode logic circuit according to claim 7, wherein said controllable current source comprises a first, fixed current source coupled to said input current node and said current switch, and a second, variable current source coupled to said input current node and being operative to supply current to said input current node in dependence upon the flow of current from said first current source through said current switch to said at least one output current switching device.

10. A current mode logic circuit according to claim 9, wherein said second current source and said current switch comprise respective first and second bipolar transistor stages.

11. A current mode logic circuit according to claim 10, wherein said first bipolar transistor stage has its base-emitter path coupled in series with the base-emitter path of said second bipolar transistor stage between first and second bias voltage terminals.

12. A current mode logic circuit according to claim 11, wherein said controllable current source is coupled to a third voltage bias terminal, and said current switch is coupled to a fourth voltage bias terminal.

13. A current mode logic circuit according to claim 11, wherein the values of said first and second bias voltages are such as to prevent said first and second bipolar transistor stages from operating in a saturation condition for said first and second input current states of said input current node.

14. A current mode logic circuit according to claim 7, wherein said at least one output current node comprises a plurality of output current nodes, and said at least one output current switching device comprises a plurality of output current switching devices respectively coupled to said plurality of output current nodes.

15. A current mode logic circuit comprising:
an input current node to which one of a first input current level representative of a first logic state and a second input current level representative of a second logic state is applied;
at least one output current node from which one of a first output current level representative of said first logic state and a second output current level representative of a said second logic state is derived;
at least one output current switching device respectively coupled to said at least one output current node;
a first current source coupled to said input current node and operative to supply a reference value current;
a second, controllable current source coupled to said input current node and operative to supply a first current value to said input current node in response to said first input current level being applied to said input current node, and operative to supply a second current value to said input current node in response to said second input current level being applied to said input current node;
a current switch coupled to said input current node, said first and second current sources and said at least one output current switching device, and being operative, in response to the application of said first input current level to said input current node, to controllably couple said reference value current supplied by said first current source to said at least one output current switching device, so as to place said at least one output current switching device in said second logic state, and being operative, in response to the application of said second input current level to said input current node to controllably prevent said reference value current supplied by said first current source from being coupled to said at least one current switching device, so as to place said at least one output current switching device in said first logic state.

16. A current mode logic circuit according to claim 15, wherein said second, controllable current source is coupled to a first prescribed voltage supply terminal, said current switch is coupled to a second prescribed voltage supply terminal, and wherein said current switch and said second, controllable current source are configured so as to operate independently of voltage fluctuations of said first and second prescribed voltage supply terminals.

17. A current mode logic circuit according to claim 15, wherein said second, controllable current source is operative to supply current to said input current node in dependence upon the flow of current from said first current source through said current switch to said at least one output current switching device.

18. A current mode logic circuit according to claim 17, wherein said second, controllable current source and said current switch comprise respective first and second bipolar transistor stages.

19. A current mode logic circuit according to claim 18, wherein said first bipolar transistor stage has its base-emitter path coupled in series with the base-emitter path of said second bipolar transistor stage between first and second bias voltage terminals.

20. A current mode logic circuit according to claim 19, wherein said second, controllable current source is coupled to a third voltage bias terminal, and said current switch is coupled to a fourth voltage bias terminal.

21. A current mode logic circuit according to claim 19, wherein the values of said first and second bias voltages are such as to prevent said first and second bipolar transistor stages from operating in a saturation condition for said first and second input current levels.

22. A current mode logic circuit according to claim 15, wherein said at least one output current node comprises a plurality of output current nodes, and said at least one output current switching device comprises a plurality of output current switching devices respectively coupled to said plurality of output current nodes.

23. A current mode logic circuit comprising:
an input current node to which one of a first input current level representative of a first logic state and a second input current level representative of a second logic state is applied;
at least one output current node from which one of a first output current level representative of a said first logic state and a second output current level representative of said second logic state is derived;
at least one output current switching device respectively coupled to said at least one output current node;
a first current source, formed of a first bipolar transistor stage, having its collector-emitter current flow path coupled between a first voltage supply terminal and said input current node and operative to supply a reference value current;
a second, controllable current source, formed of a second bipolar transistor stage, having its collector-emitter current flow path coupled between said first voltage supply terminal and said input current node and operative to supply a first current value to said input current node in response to said first input current level being applied to said input current node, and operative to supply a second current value to said input current node in response to said second input current level being applied to said input current node;
a current switch, formed of a third bipolar transistor stage, having its collector-emitter current flow path coupled between said first current source and said at least one output current switching device, and having its base-emitter path coupled in series with the base-emitter path of said second bipolar transistor stage between first and second bias voltage terminals, and being operative, in response to the application of said second input current level to said input current node, to controllably couple said reference value current supplied by said first current source to said at least one output current switching device, so as to cause said at least one output current switching device to output said first output current level to said at least one output node, respectively, and being operative, in response to the application of said first input current level to said input current node, to controllably prevent said reference value current supplied by said first current source from being coupled to said at least one current switching device, so as to cause said at least one output current switching device to output said second output current level to said at least one output node, respectively.

24. A current mode logic circuit according to claim 23, wherein said at least one output current switching device is operative to produce an output current in excess of said reference value current.

25. A current mode logic circuit according to claim 24, wherein said third bipolar transistor stage comprises a current flow control transistor and a current drive transistor having their collector-emitter current flow paths coupled in series between said first current source and a second voltage supply terminal, and wherein said at least one output current switching device comprises a corresponding at least one fourth bipolar transistor stage having its collector-emitter path coupled between said at least one output current node and said second voltage supply terminal.

26. A current mode logic circuit according to claim 25, wherein the current output of said at least one fourth bipolar transistor is larger than said reference value current that flows through said current drive transistor.

27. A current mode logic circuit according to claim 24, wherein said at least one output current switching device comprises a corresponding at least one fourth bipolar transistor stage having its collector-emitter path coupled to said at least one output current node and being sized such that the magnitude of said first output current is larger than the magnitude of said reference value current.

28. A current mode logic circuit according to claim 23, wherein the values of first and second bias voltages coupled to said first and second bias voltage terminals are such that, in the presence of either of said first and second input current levels applied to said input current node, the forward base emitter voltage of neither of said second and third transistor stages is sufficient to drive either of said second and third transistor stages into a current flow saturation condition.

29. A current mode logic circuit according to claim 23, wherein the value of said first bias voltage as such that, in the presence of said first input current level applied to said input current node, the forward base-emitter voltage of said second transistor stage is sufficient to cause said second transistor stage to supply said first current value which, when summed at said input current node with said reference current value, corresponds to said first output current.

30. A current mode logic circuit according to claim 28, wherein the value of said second bias voltage is such that, in the presence of said second input current level applied to said input current node, the forward base-emitter voltage of said third transistor stage is sufficient to cause said third transistor stage to couple said reference current value through its collector-emitter path, whereby said at least one current output switching device is driven to output said first output current level.

31. A current mode logic circuit according to claim 23, wherein the values of first and second bias voltages coupled to said first and second bias voltage terminals and said reference current value are such that the difference between the voltage at said input current node, when said first input current level is applied to said input current node, and the voltage at said input current node, when said second input current level is applied to said input current node, is on the order of 100 mv or less.

32. A current mode logic circuit according to claim 23, wherein the values of said first and second bias voltages are such as to prevent said second and third bipolar transistor stages from operating in a saturation condition for said first and second input current levels.

33. A current mode logic circuit according to claim 23, wherein said second bipolar transistor stage is operative to supply current to said input current node in dependence upon the flow of current from said first current source through said third bipolar transistor stage to said at least one output current switching device.

34. A current mode logic circuit according to claim 23, wherein said at least one output current switching device is coupled to a second voltage supply terminal and said third bipolar transistor stage.

35. A current mode logic circuit according to claim 23, wherein said at least one output current[node comprises a plurality of output current nodes, and said at least one output current switching device comprises a plurality of output current switching devices respectively coupled to said plurality of output current nodes.

36. A current mode NOR gate circuit comprising:
a plurality of input terminals to each of which one of a first input current level representative of a first logic state and a second input current level representative of a second logic state is applied;
an input current node coupled to each of said plurality of input terminals;
an output current node from which one of a first output current level representative of said first logic state and a second output current level representative of a said second logic state is derived;
an output current switching device coupled to said output current node;
a first current source coupled to said input current node and operative to supply a reference value current;
a second, controllable current source coupled to said input current node and operative to supply a first current value to said input current node in response to said first input current level being applied to said input current node from one of said plurality of input terminals, and operative to supply a second current value to said input current node is response to said second input current level being applied to said input current node from each of said plurality of input terminals;
a current switch coupled to said input current node, said first and second current sources and said output current switching device, and being operative in response to the application of said second input current level to said input current node from each of said plurality of input terminals, to controllably couple said reference value current supplied by said first current source to said output current switching device, so as to place said output current switching device in said first logic state, and being operative, in response to the application of said first input current level to said input current node from one of said plurality of input terminals, to controllably prevent said reference value current supplied by said first current source from being coupled to said output current switching device, so as to place said output current switching device in said second logic state.

37. A current mode NOR gate circuit according to claim 36, wherein said second, controllable current source is coupled to a first prescribed voltage supply terminal, said current switch is coupled to a second prescribed voltage supply terminal, and wherein said current switch and said second, controllable current source are configured so as to operate independently of voltage fluctuations of said first and second prescribed voltage supply terminals.

38. A current mode NOR gate circuit according to claim 36, wherein said second, controllable current source is operative to supply current to said input current node in dependence upon the flow of current from said first current source through said current switch to said output current switching device.

39. A current mode NOR gate circuit according to claim 36, wherein said second, controllable current source and said current switch comprise respective first and second bipolar transistor stages.

40. A current mode NOR gate circuit according to claim 39, wherein said first bipolar transistor stage has its base-emitter path coupled in series with the base-emitter path of said second bipolar transistor stage between first and second bias voltage terminals.

41. A current mode NOR gate circuit according to claim 40, wherein the values of said first and second bias voltages are such as to prevent said first and second bipolar transistor stages from operating in a saturation condition for said first and second input current levels.

42. A current mode NOR gate circuit according to claim 40, wherein said first current source is coupled to a third voltage bias terminal.

43. A current mode NOR gate circuit comprising:
a plurality of input terminals to each of which one of a first input current level representative of a first logic state and a second input current level representative of a second logic state is applied;
an input current node coupled to each of said plurality of input terminals;
an output current node from which one of a first output current level representative of a said first logic state and a second output current level representative of said second logic state is derived;
an output current switching device coupled to said output current node;
a first current source, formed of a first bipolar transistor stage, having its collector-emitter current flow path coupled between a first voltage supply terminal and said input current node and operative to supply a reference value current;
a second, controllable current source, formed of a second bipolar transistor stage, having its collector-emitter current flow path coupled between said first voltage supply terminal and said input current node and operative to supply a first current value to said input current node in response to said first input current level being applied to said input current node from one of said input terminals, and operative to supply a second current value to said input current node in response to said second input current level being applied to said input current node from each of said input terminals;
a current switch, formed of a third bipolar transistor stage, having its collector-emitter current flow path coupled between said first current source and said at least one output current switching device, and having its base-emitter path coupled in series with the base-emitter path of said second bipolar transistor stage between first and second bias voltage terminals, and being operative, in response to the application of said second input current level to said input current node from each of said input terminals, to controllably couple said reference value current supplied by said first current source to said output current switching device, so as to cause said output current switching device to output said first output current level to said output node, and being operative, in response to the application of said first input current level to said input current node from any of said input terminals, to controllably prevent said reference value current supplied by said first current source from being coupled to said output current switching device, so as to cause said output current switching device to output said second output current level to said output node.

44. A current mode NOR gate circuit according to claim 43, wherein the values of said first and second bias voltages are such as to prevent said second and third bipolar transistor stages from operating in a saturation condition for said first and second input current levels.

45. A current mode NOR gate circuit according to claim 43, wherein said second bipolar transistor stage is operative to supply current to said input current node in dependence upon the flow of current from said first current source through said third bipolar transistor stage to said output current switching device.

46. A current mode NOR gate circuit according to claim 43 wherein said output current switching switch is coupled to a second voltage supply terminal and said third bipolar transistor stage.

* * * * *